(12) United States Patent
Kumar et al.

(10) Patent No.: US 8,441,838 B2
(45) Date of Patent: May 14, 2013

(54) RESISTIVE-SWITCHING NONVOLATILE MEMORY ELEMENTS

(75) Inventors: Pragati Kumar, Santa Clara, CA (US); Sean Barstow, San Jose, CA (US); Tony Chiang, Campbell, CA (US); Sandra G. Malhotra, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/333,742

(22) Filed: Dec. 21, 2011

(65) Prior Publication Data

US 2012/0319070 A1    Dec. 20, 2012

Related U.S. Application Data

(62) Division of application No. 12/114,667, filed on May 2, 2008, now Pat. No. 8,144,498.

(60) Provisional application No. 60/928,648, filed on May 9, 2007.

(51) Int. Cl.
*G11C 11/00* (2006.01)

(52) U.S. Cl.
USPC .......................... 365/148; 365/100; 365/163

(58) Field of Classification Search .................. 365/46, 365/94, 100, 113, 129, 148, 163; 257/2–5, 257/9, 296, 310, E21.35, E31.047, E27.006; 438/29, 95, 96, 166, 135, 240, 259, 365, 438/482, 486, 597, 785; 97/754
See application file for complete search history.

(56) References Cited

U.S. PATENT DOCUMENTS

| | | | |
|---|---|---|---|
| 6,203,613 B1* | 3/2001 | Gates et al. | 117/104 |
| 2007/0099366 A1* | 5/2007 | Ahn et al. | 438/197 |
| 2007/0228414 A1* | 10/2007 | Kumar et al. | 257/183 |

* cited by examiner

*Primary Examiner* — Harry W Byrne

(57) ABSTRACT

Nonvolatile memory elements are provided comprising switching metal oxides. The nonvolatile memory elements may be formed in one or more layers on an integrated circuit. Each memory element may have a first conductive layer, a metal oxide layer, and a second conductive layer. Electrical devices may be coupled in series with the memory elements. The first conductive layer may be formed from a metal nitride. The metal oxide layer may contain the same metal as the first conductive layer. The metal oxide may form an ohmic contact or a Schottky contact with the first conductive layer. The second conductive layer may form an ohmic contact or a Schottky contact with the metal oxide layer. The first conductive layer, the metal oxide layer, and the second conductive layer may include sublayers. The second conductive layer may include an adhesion or barrier layer and a workfunction control layer.

11 Claims, 4 Drawing Sheets

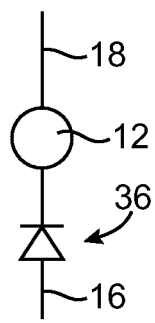
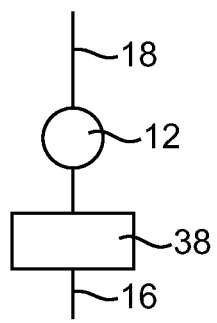
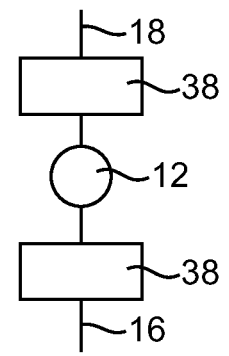
FIG. 4   FIG. 5   FIG. 6
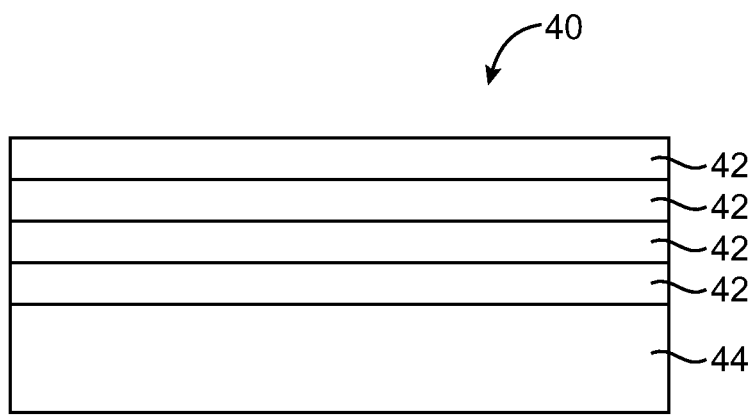
FIG. 7

RESISTIVE-SWITCHING NONVOLATILE MEMORY ELEMENTS

This application is a Divisional application of U.S. patent application Ser. No. 12/114,667 entitled "Resistive-Switching Nonvolatile Memory Elements" filed on May 2, 2008 now U.S. Pat. No. 8,144,498 and claiming priority to provisional patent application No. 60/928,648, filed May 9, 2007, both of which are hereby incorporated by reference herein in their entirety.

BACKGROUND

This invention relates to nonvolatile memory elements formed from resistive-switching metal oxides.

Such nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

As device dimensions shrink, scaling issues are posing challenges for the manufacture of traditional nonvolatile memory technologies. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on metal oxide switching elements has been demonstrated. However, such switching elements often exhibit at least one of i) insufficiently high resistances for the "high" (i.e. "off") and/or "low" (i.e. "on") states, ii) insufficiently low off state and/or reset currents, iii) poor switching behavior, iv) poor electrical distribution, v) low yield, vi) poor thermal stability, and/or vii) poor reliability to be of use in practical devices.

It would therefore be desirable to be able to form high quality resistive switching nonvolatile memory elements that address at least some of these areas and perhaps others.

SUMMARY

In accordance with the present invention, nonvolatile resistive switching memory elements for integrated circuits such as memory arrays are formed. The nonvolatile memory elements may each have a first conductive layer, a resistive-switching metal oxide layer, and a second conductive layer. The nonvolatile memory elements may be stacked in layers to form a stacked memory array.

The metal oxide may be formed using metals such as transition metals. Dopant may be added to the metal oxide.

The first conductive layer may be formed from a metal nitride. The metal nitride may be a binary or ternary metal nitride and may include more than one metal. The most prevalent metal in the metal nitride is the same as the most prevalent metal in the metal oxide layer.

The second conductive layer may include i) an (optional) adhesion/barrier layer and ii) a workfunction control layer formed from a high workfunction metal (e.g., platinum, iridium, palladium, nickel, rhenium, rhodium, etc.) or metal compound (e.g. iridium oxide, ruthenium oxide, titanium aluminum nitride, etc.).

The metal oxide may form an ohmic contact or Schottky contact with the first conductive layer. The second conductive layer may form an ohmic contact or Schottky contact with the metal oxide layer. Preferably, the first or second conductive layer forms an ohmic contact with the metal oxide and the opposing contact forms a Schottky contact with the metal oxide.

In one preferred embodiment, the first conductive layer is a metal nitride wherein the most prevalent metal in the metal nitride is the same as the most prevalent metal in the metal oxide layer and said first conductive layer forms an ohmic contact with the metal oxide, while the second conductive layer forms a Schottky contact with the metal oxide. In another embodiment, the aforementioned second conductive layer is formed from a high workfunction metal (e.g., platinum, iridium, palladium, nickel, rhenium, rhodium, etc.) or metal compound (e.g. iridium oxide, ruthenium oxide, titanium aluminum nitride, etc.). In another embodiment, the aforementioned metal oxide is non-stoichiometric.

Further features of the invention, its nature and various advantages will be more apparent from the accompanying drawings and the following detailed description.

BRIEF DESCRIPTION OF THE DRAWINGS

FIG. 4 is a schematic diagram of an illustrative resistive switching memory element in series with a diode in accordance with an embodiment of the present invention.

FIG. 5 is a schematic diagram of an illustrative resistive switching memory element in series with an electrical device in accordance with an embodiment of the present invention.

FIG. 6 is a schematic diagram of an illustrative resistive switching memory element in series with two electrical devices in accordance with an embodiment of the present invention.

FIG. 7 is a cross-sectional diagram of an illustrative stacked memory containing multiple layers of resistive switching nonvolatile memory elements in accordance with an embodiment of the present invention.

DETAILED DESCRIPTION

Embodiments of the present invention relate to nonvolatile memory formed from resistive switching elements. Embodiments of the invention also relate to resistive switching nonvolatile memory element structures and fabrication methods that may be used to form such structures.

Resistive switching elements may be formed on any suitable type of integrated circuit. Most typically, resistive switching memory elements may be formed as part of a high-capacity nonvolatile memory integrated circuit. Nonvolatile memory integrated circuits are often used in portable devices such as digital cameras, mobile telephones, handheld computers, and music players. In some arrangements, a nonvolatile memory device may be built into mobile equipment such as a cellular telephone. In other arrangements, nonvolatile memory devices are packaged in memory cards or memory keys that can be removably installed in electronic equipment by a user.

The use of resistive switching memory elements to form memory arrays on memory devices is merely illustrative. In general, any suitable integrated circuit may be formed using the resistive switching structures of the present invention. Fabrication of memory arrays formed of resistive switching memory elements is described herein as an example.

Figure 1:
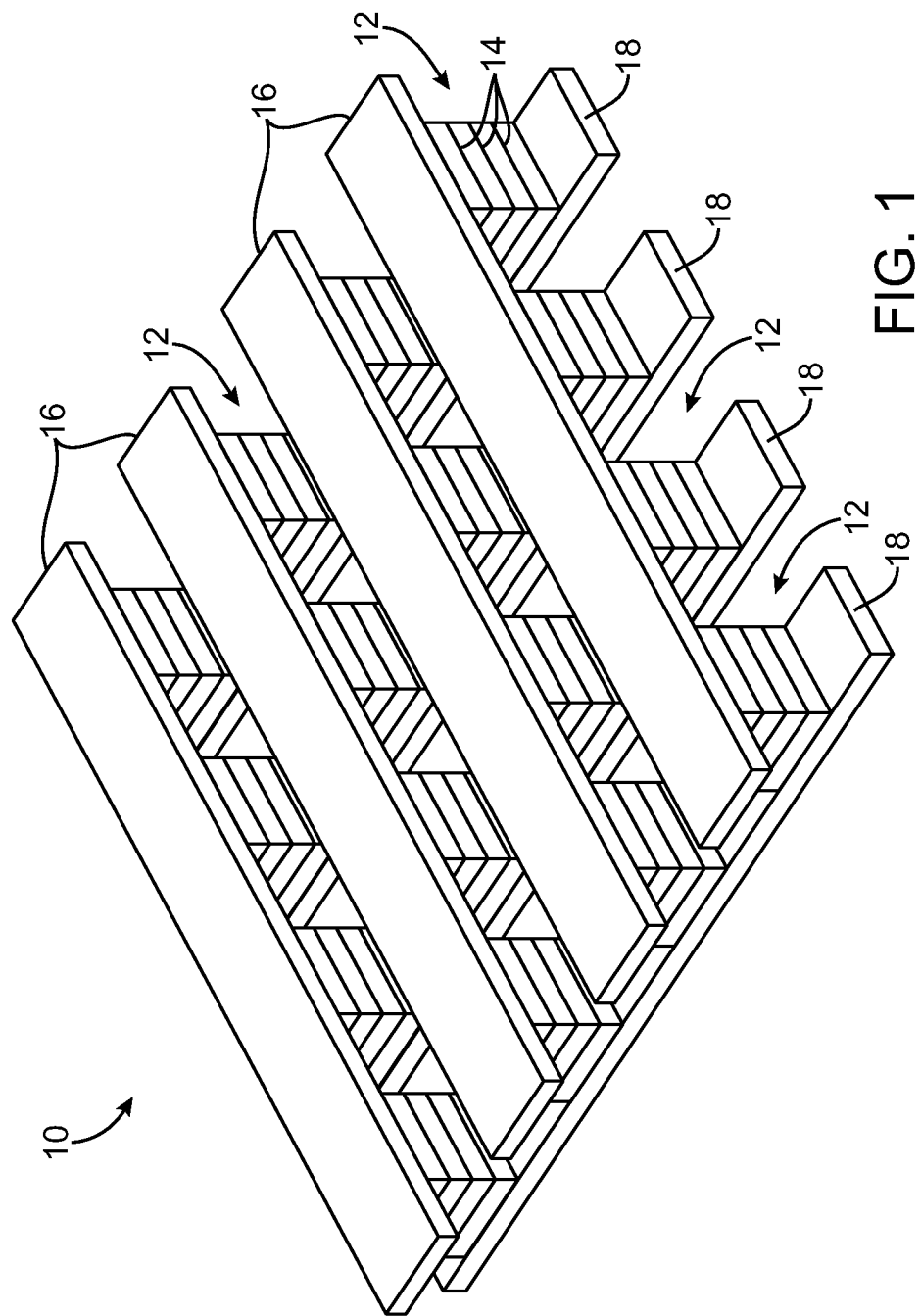
FIG. 1 is a diagram of an illustrative array of resistive switching memory elements in accordance with an embodiment of the present invention.

An illustrative memory array 10 of nonvolatile resistive switching memory elements 12 is shown in FIG. 1. Memory array 10 may be part of a memory device or other integrated circuit. Read and write circuitry is connected to memory elements 12 using conductors 16 and orthogonal conductors 18. Conductors such as conductors 16 and conductors 18 are sometimes referred to as word lines and bit lines and are used to read and write data into the elements 12 of array 10. Individual memory elements 12 or groups of memory elements 12 can be addressed using appropriate sets of conductors 16 and 18. Memory elements 12 may be formed from one or more layers of materials, as indicated schematically by lines 14 in FIG. 1. In addition, memory arrays such as memory array 10 can be stacked in a vertical fashion to make multilayer memory array structures.

During a read operation, the state of a memory element 12 can be sensed by applying a sensing voltage to an appropriate set of conductors 16 and 18. Depending on its history, a memory element that is addressed in this way may be in either a high resistance state (i.e. "off" state) or a low resistance state (i.e. "on" state). The resistance of the memory element therefore determines what digital data is being stored by the memory element. If the memory element has a high resistance, for example, the memory element may be said to contain a logic one (i.e., a "1" bit). If, on the other hand, the memory element has a low resistance, the memory element may be said to contain a logic zero (i.e., a "0" bit). During a write operation, the state of a memory element can be changed by application of suitable write signals to an appropriate set of conductors 16 and 18.

Figure 2A:
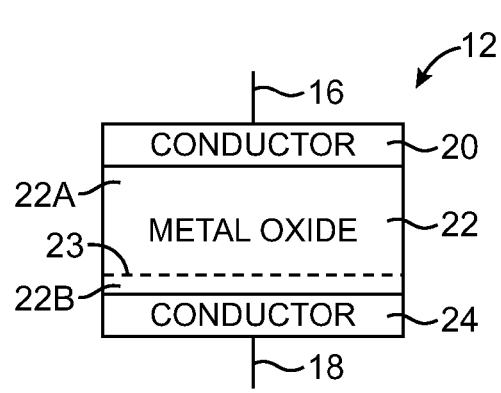
FIG. 2A is a cross-sectional view of an illustrative resistive switching nonvolatile memory element in accordance with an embodiment of the present invention.

A cross-section of an illustrative embodiment of a resistive switching nonvolatile memory element is shown in FIG. 2A. In the example of FIG. 2A, memory element 12 is formed from a metal oxide 22 and has conductive electrodes 20 and 24. When constructed as part of an array such as array 10 of FIG. 1, conductive lines such as lines 16 and 18 may be physically and electrically connected to electrodes 20 and 24. Such conductive lines may be formed from metals or other conductive materials (e.g., tungsten, aluminum, copper, metal silicides, doped polysilicon, doped silicon, combinations of these materials, etc.). If desired, conductive line 16 and conductive line 18 may serve as both conductive lines and as electrodes. In this type of arrangement, line 16 may serve as electrode 20, so that no separate conductor is needed to form an upper electrode for element 12. Similarly, line 18 may serve as electrode 24, so that no separate conductor is needed for the lower electrode of element 12.

In the diagram of FIG. 2A, conductive lines 16 and 18 are shown schematically as being formed in contact with electrodes 20 and 24. Other arrangements may be used if desired. For example, there may be intervening electrical components (e.g., diodes, p-i-n diodes, silicon diodes, silicon p-i-n diodes, transistors, etc.) that are formed between line 16 and electrode 20 or between line 18 and electrode 24.

Metal oxide layer 22 may be formed from a single layer of material or from multiple sublayers of material. As shown by dotted line 23, for example, metal oxide 22 may be formed from metal oxide sublayer 22A and metal oxide sublayer 22B. There may, in general, be any suitable number of sublayers in metal oxide 22 (e.g., three or more sublayers, four or more sublayers, etc.). The depiction of two sublayers in FIG. 2A is merely illustrative.

Each sublayer in metal oxide 22 may be formed using a different fabrication process and/or different materials. For example, sublayers 22A and 22B may be formed by oxidizing a conductive layer 24 that is formed from titanium nitride. The resulting sublayers 22B and 22A may have compositions of $Ti_{x1}O_{y1}N_{z1}$ and $Ti_{x2}O_{y2}N_{z2}$, respectively. The value of z2 may be much less than the value of z1 (e.g., ten or more times less). In this type of scenario, the sublayers 22B and 22A of metal oxide layer 22 contain nitrogen. Most of layer 22 (i.e., layer 22A) will generally not contain nitrogen in any significant quantity, but one or more associated sublayers (such as sublayer 22B) may be nitrogen rich. If desired, layers such as layers 22A and 22B may be deposited using sputtering techniques (as an example). During sputtering, gas pressures may be varied continuously or discretely to produce layers with continuously varying or discretely varying compositions.

Sublayers such as sublayers 22A and 22B may have any suitable thicknesses. For example, sublayers 22A and 22B may have layer thicknesses of 5-150 angstroms, 20-250 angstroms, 50-2000 angstroms, etc.

Figure 2B:
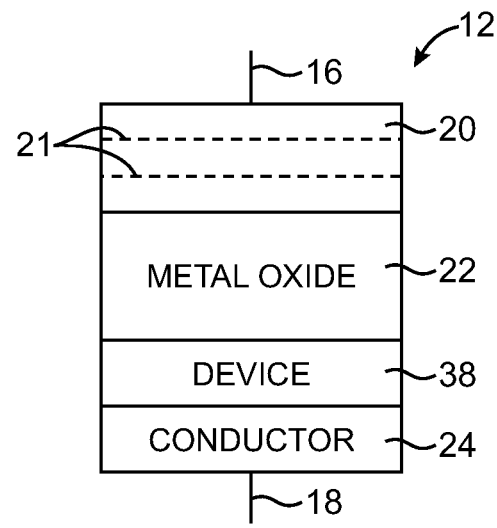
FIG. 2B is a cross-sectional view of an illustrative resistive switching nonvolatile memory element in accordance with another embodiment of the present invention.

If desired, there may be a series-connected electrical component between one of the conductive layers of device 12 and the resistive switching metal oxide. An illustrative arrangement in which there is an intervening electrical component 38 between conductor 24 and metal oxide 22 is shown in FIG. 2B.

As indicated schematically by dotted lines 21, conductive materials for structures such as electrodes 24 and 20 may be formed from one or more layers of materials. These layers may include adhesion layers, barrier layers, and workfunction control layers (as examples).

An adhesion layer may have a thickness of, for example, about 5 to 50 angstroms and may be formed directly in contact with metal oxide layer 22 to promote adhesion of other layers to metal oxide layer 22. Some materials such as high workfunction noble materials (e.g., Pt) do not always adhere well when formed directly in contact with metal oxide layer 22. The presence of an adhesion layer in this type of situation may help the high work function layer to adhere. Adhesion layers may be formed form any suitable materials. As an example, an adhesion layer may be formed from titanium, tantalum, or tungsten, and any of their nitrides, carbides, silicides, and/or combinations thereof.

A barrier layer may be used to prevent interdiffusion between the materials that form the conductive electrode of element 12 and the materials in metal oxide layer 22. The barrier layer may be formed of any suitable material. The barrier layer may have a thickness of about 5-1000 angstroms (as an example), but preferably from about 5 to 50 angstroms. The barrier layer may also serve as an adhesion layer. Examples of barrier layers include refractory metal (e.g. titanium, tantalum, tungsten, etc.) nitrides, carbides, carbon nitrides, and/or silicon nitrides. In an element 12 that has separate adhesion and barrier layers, the adhesion layer may be formed in contact with metal oxide layer 22 and the barrier layer may be formed in contact with the adhesion layer.

A workfunction control layer is a layer of material (e.g., metal) that effectively determines the workfunction of an electrode on metal oxide layer 22. The workfunction control layer may be formed on metal oxide 22 or may be formed on an adhesion and/or barrier layer. The workfunction control layer may have a high workfunction (e.g., greater than 4.5 eV or 5.0 eV). In the case when the workfunction control layer is used in conjunction with an adhesion layer and/or barrier layer, it is preferable that the thickness of the adhesion layer, barrier layer or the sum of the adhesion and barrier layers is less than or equal to 100 angstroms, and more preferably less than or equal to 50 angstroms so that the workfunction control layer still remains the primary layer for setting the effective workfunction of the electrode on the metal oxide layer. The work function control layer is typically approximately 50 angstroms or greater in thickness.

Examples of materials that may be used to form electrodes 20 and 24 include metals (e.g., refractory or transition metals), metal alloys, metal nitrides (e.g., refractory metal nitrides), metal silicon nitrides (i.e., materials containing refractory metals, transition metals, or other metals, along with silicon and nitrogen), metal carbides, metal carbon nitrides, metal silicides, or other conductors. The metal nitrides used for electrodes 20 and 24 may be binary nitrides (i.e., $Me_xN_y$, where Me is a metal), ternary nitrides (e.g., $Me1_xMe2_yN_z$, where Me1 and Me2 are metals), or other suitable nitrides.

Metal oxide 22 may be formed from a metal oxide such as a transition metal oxide, e.g., cobalt-based, nickel-based, copper-based, zinc-based, titanium-based, zirconium-based, hafnium-based, vanadium-based, niobium-based, tantalum based, chromium-based, molybdenum-based, tungsten-based, or manganese-based oxides or other oxides such as aluminum-based oxides. One or more dopants may be incorporated into metal oxide 22. Examples of dopants that may be incorporated into metal oxide 22 include but are not limited to Ti, Ni, Co, Zr, V, Al, and Nb.

In general, electrodes 20 and 24 and metal oxide 22 may each contain one or more metals. The metal that is present in the largest atomic concentration in a given layer is herein referred to as the most prevalent metal in that layer.

It has been found that improved non-volatile switching behavior (including but not limited to yield and stability) can be achieved when the first electrode 24 or second electrode 20 forms an ohmic contact with metal oxide 22. Moreover, it is preferable that the electrode opposite the ohmic contact is chosen to form a Schottky contact with the metal oxide 22. Preferably, the metal oxide 22 is chosen to be non-stoichiometric (e.g., by including but not being limited to metal deficient, metal rich, oxygen deficient, or oxygen rich materials) to enable defects (e.g., including but not being limited to metal vacancies, metal interstitials, oxygen vacancies, or oxygen interstitials) and/or charge carriers to form in the metal oxide.

In addition, it is desirable to choose an electrode layer that is thermally stable (e.g. does not agglomerate, de-wet, delaminate, etc.) and does not negatively react with the metal oxide during subsequent processing steps (e.g. during silicon-based diode formation, dopant activation, etc. wherein processing temperatures can exceed 500° C. and 700° C., respectively).

Choosing one of the electrodes to be a metal nitride (e.g. $Me_xN_y$), metal silicon nitride (e.g. $Me_xSi_yN_z$) or metal carbon nitride (e.g. $Me_xC_yN_z$) where the most prevalent metal in the electrode is the same as the most prevalent metal in a non-stoichiometric metal oxide 22 can enable the formation of a thermally stable, ohmic or Schottky contact with good switching characteristics. For example, a first electrode 24 may be titanium nitride and contain Ti and metal oxide 22 may be a (doped or undoped) non-stoichiometric titanium oxide layer which is nominally n-type. An electrode material with a work function less than the work function of the metal oxide will usually form an ohmic contact when the metal oxide behaves like an n-type material. Group IVB, VB, VIB, and VIIB metal nitrides generally form low work function compounds. Thus titanium nitride in contact with titanium oxide forms a thermally stable ohmic contact. In the case when the non-stoichiometric metal oxide is nominally p-type, then an electrode material with a work function less than the work function of the metal oxide will usually form a Schottky contact. Other examples of most prevalent metals include but are not limited to zirconium, hafnium, vanadium, niobium, tantalum, chromium, molybdenum, and tungsten. In addition, generally, a metal nitride based on a metal located lower on the periodic table will form a lower work function material than a metal nitride formed from a metal located higher on the periodic table. Therefore, in the example wherein the metal oxide is titanium oxide based, a tantalum nitride electrode can also be used to achieve similar results as titanium nitride.

Another advantage to forming metal oxide 22 from the same metal as the electrode is that this can potentially eliminate the need to change process chambers between the operations used to form the electrode and the operations used to form metal oxide layer 22.

The interface that is formed between electrode 20 and metal oxide 22 may be a Schottky contact or an ohmic contact. The interface that is formed between electrode 24 and metal oxide 22 may also be a Schottky contact or an ohmic contact. It is preferable that opposing electrodes form opposite contact types. With one suitable arrangement, electrode 24 and metal oxide 22 form an ohmic contact (e.g., using a metal nitride for electrode 24) and metal oxide 22 and electrode 20 form a Schottky contact (e.g., using for example an optional adhesion layer and a workfunction control layer for electrode 20). In the case of the titanium-based n-type metal oxide example, electrode 24 is chosen to be titanium nitride to form an ohmic contact to the titanium-based n-type metal oxide. Additionally, a high work function material such as Pt, Ir, $IrO_2$, etc. is chosen as the opposing electrode 20 to form a Schottky contact (i.e., the work function of the electrode is greater than the work function of the n-type metal oxide). A thin adhesion/barrier layer, preferably less than or equal to about 50 angstroms, and more preferably less than or equal to about 20 angstroms can be optionally used. The thickness of the adhesion/barrier layer should be chosen such that adhesion can be improved while not negatively impacting the work function controlling layer material.

Resistive switching memory element 12 exhibits a bistable resistance. When resistive switching memory element 12 is in a high resistance state, it may be said to contain a logic one. When resistive switching memory element 12 is in a low resistance state, it may be said to contain a logic zero. (If desired, high resistance can signify a logic zero and low resistance can signify a logic one.) The state of resistive switching memory element 12 may be sensed by application of a sensing voltage. When it is desired to change the state of resistive switching memory element 12, read and write circuitry may apply suitable control signals to suitable lines 16 and 18.

By proper selection of the process parameters used to fabricate metal oxide 22, a resistive switching metal oxide may be formed that exhibits a relatively large resistance. For example, metal oxide 22 in device 12 may exhibit a high-state resistivity of at least one ohm-cm, at least ten ohm-cm, or at least 100 ohm-cm or more. The ratio of the high-state resistance of element 12 to the low-state resistance of element 12 may be greater than five or ten (as an example).

Figure 3:
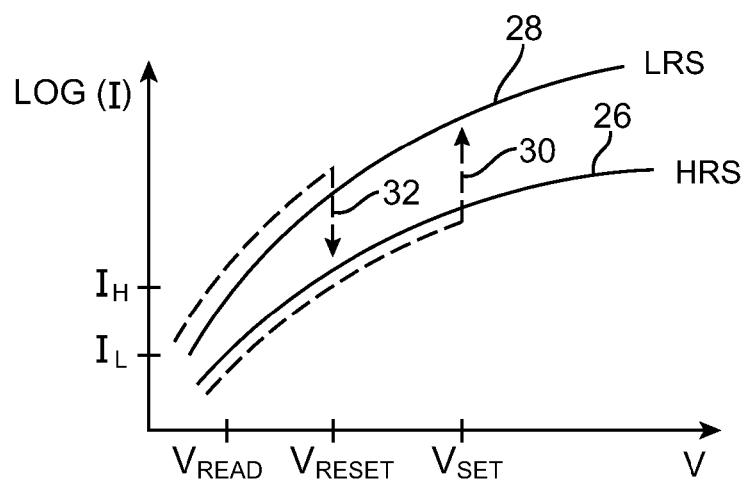
FIG. 3 is a graph showing how resistive switching nonvolatile memory elements of the types shown in FIGS. 2A and 2B may exhibit bistable behavior in accordance with an embodiment of the present invention.

A current (I) versus voltage (V) plot for device 12 is shown in FIG. 3. Initially, device 12 may be in a high resistance state (e.g., storing a logic one). In this state, the current versus voltage characteristic of device 12 is represented by solid line HRS 26. The high resistance state of device 12 can be sensed by read and write circuitry associated with an array of devices 12. For example, read and write circuitry may apply a read voltage $V_{READ}$ to device 12 and can sense the resulting low current $I_L$ that flows through device 12. When it is desired to store a logic zero in device 12, device 12 can be placed into its low-resistance state. This may be accomplished by using read and write circuitry to apply a voltage $V_{SET}$ across terminals 16 and 18 of device 12. Applying $V_{SET}$ to device 12 causes device 12 to enter its low resistance state, as indicated by dotted line 30. In this region, the structure of device 12 is changed (e.g., through the formation of current filaments through metal oxide 22 or other suitable mechanisms), so that, following removal of the voltage $V_{SET}$, device 12 is characterized by low resistance curve LRS 28.

The low resistance state of device 12 can be sensed using the read and write circuitry. When a read voltage $V_{READ}$ is applied to resistive switching memory element 12, the read and write circuitry will sense the relatively high current value $I_H$, indicating that device 12 is in its low resistance state. When it is desired to store a logic one in device 12, device 12 can once again be placed in its high resistance state by applying a voltage $V_{RESET}$ to device 12. When the read and write circuitry applies $V_{RESET}$ to device 12, device 12 enters its high resistance state HRS, as indicated by dotted line 32. When the voltage $V_{RESET}$ is removed from device 12, device 12 will once again be characterized by high resistance line HRS 26.

The bistable resistance of resistive switching memory element 12 makes memory element 12 suitable for storing digital data. Because no changes take place in the stored data in the absence of application of the voltages $V_{SET}$ and $V_{RESET}$, memory formed from elements such as element 12 is non-volatile.

Any suitable read and write circuitry and array layout scheme may be used to construct a nonvolatile memory device from resistive switching memory elements such as element 12. For example, horizontal and vertical lines 16 and 18 may be connected directly to the terminals of resistive switching memory elements 12. This is merely illustrative. If desired, other electrical devices may be associated with each element 12.

An example is shown in FIG. 4. As shown in FIG. 4, a diode 36 may be placed in series with resistive switching memory element 12. Diode 36 may be a Schottky diode, a p-n diode, a p-i-n diode, or any other suitable diode.

If desired, other electrical components can be formed in series with resistive switching memory element 12. As shown in FIG. 5, series-connected electrical device 38 may be coupled to resistive switching memory element 12. Device 38 may be a diode, a transistor, or any other suitable electronic device. Because devices such as these can rectify or otherwise alter current flow, these devices are sometimes referred to as rectifying elements or current steering elements. As shown in FIG. 6, two electrical devices 38 may be placed in series with a resistive switching memory element 12. Electrical devices 38 may be formed as part of a nonvolatile memory element or may be formed as separate devices at potentially remote locations relative to a resistive switching metal oxide and its associated electrodes.

Memory elements 12 may be fabricated in a single layer in array 10 or may be fabricated in multiple layers forming a three-dimensional stack (with or without associated electrical devices 38). An advantage of forming memory arrays such as memory array 10 of FIG. 1 using a multilayer memory element scheme is that this type of approach allows memory element density to be maximized for a given chip size.

An illustrative integrated circuit 40 that contains multiple layers of memory elements is shown in FIG. 7. As shown in FIG. 7, integrated circuit 40 has a substrate 44 (e.g., a silicon wafer). Multiple layers 42 of resistive switching nonvolatile memory elements 12 have been formed on substrate 44. In the example of FIG. 7, there are four layers 42 on substrate 44. This is merely illustrative. There may be any suitable number of layers of resistive switching memory elements 12 on an integrated circuit. Typically, each layer is laid out in a cross-point array similar to that depicted in FIG. 1.

Each layer 42 may contain identical memory elements 12 or some or all of layers 42 may contain different types of memory elements. Consider, as an example, a situation in which a first layer of memory elements 12 is formed on substrate 44 and a second layer of memory elements 12 is formed on the first layer of memory elements. In this situation, the first layer of memory elements may have lower electrodes and metal oxide layers in which the most prevalent metal is the same (e.g., titanium), whereas the second layer of memory elements may have lower electrodes and metal oxide layers in which the most prevalent metal is the same (e.g., hafnium), but in which the most prevalent metal is not the same as the most prevalent metal in the first layer. If desired, the most prevalent metal in the lower electrode and metal oxide layer of elements 12 may be identical. For example, titanium may be used in the lower electrodes and metal oxide layers of all layers of elements 12 in a stacked memory integrated circuit.

The layers of material that are formed when fabricating elements 12 may be deposited using any suitable techniques. Illustrative deposition techniques include physical vapor deposition (e.g., sputter deposition or evaporation), chemical vapor deposition, atomic layer deposition, electrochemical deposition (e.g., electroless deposition or electroplating), ion implantation (e.g., ion implantation followed by annealing operations), thermal oxidation, etc.

Figure 8:
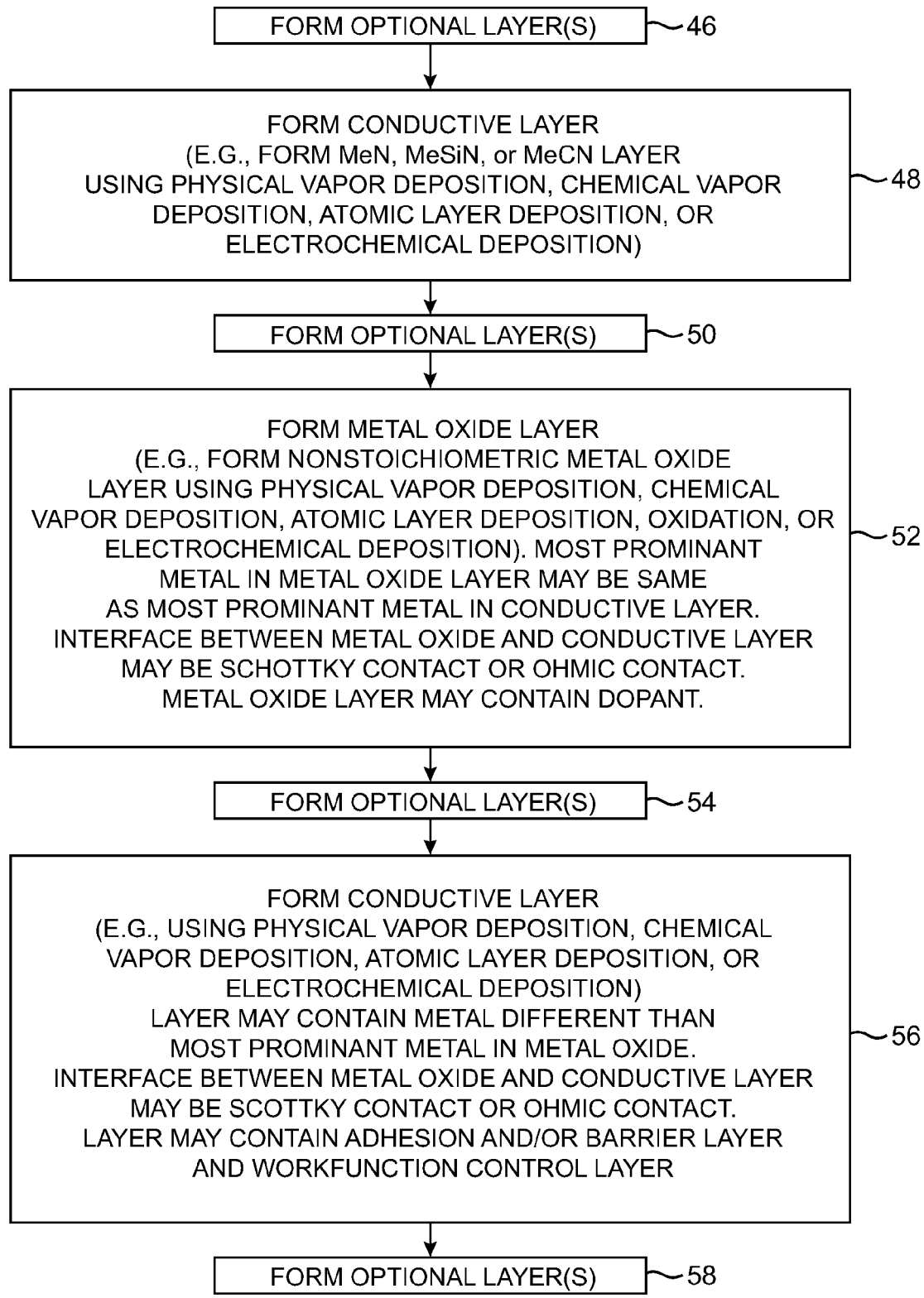
FIG. 8 is a flow chart of illustrative steps involved in forming resistive switching memory elements for nonvolatile memory devices in accordance with an embodiment of the present invention.

A typical fabrication process is shown in FIG. 8. At step 46, one or more optional layers are formed. For example, layers of material that form underlying routing structures or lower layers of memory elements 12 may be formed on a silicon wafer or other suitable substrate. If desired, layers of material that form current steering elements such as current steering elements 38 of FIG. 6 may be deposited.

At step 48, a first conductive layer such as conductive layer 24 of FIGS. 2A and 2B may be formed. Conductive layer 24 may be formed on lower circuit layers. Conductive layer 24 may, as an example, be formed on an underlying line 18 on device 10 or may be formed as part of line 18. Conductive layer 24 may be deposited on lower layer structures from step 46. For example, layer 24 may be deposited on a substrate, layers of nonvolatile memory elements (e.g., when the integrated circuit being formed is a stacked memory device), conductive layers such as lines 18 for routing, insulating layers for insulating conductive routing lines and nonvolatile memory elements from each other, or any other suitable layers of material.

Layer 24 may be formed from metal, metal nitrides, metal silicides, or other suitable conductive materials. Layer 24 is preferably formed of a metal nitride of the form $Me_mN_n$, where Me is a metal from group IVB, VB, or VIB. Conductive layers of this type form stable conductive interfaces with subsequently deposited metal oxide layers and may allow for good workfunction matching between conductive layer 24 and metal oxide layer 22 to form either ohmic or Schottky contacts depending on whether the metal oxide subsequently formed is either n-type or p-type respectively. The workfunction of metals from groups IVB, VB, and VIB tend to decrease as one moves down columns in the periodic table. For example, in group IVB, the workfunction of Ti is greater than the workfunction of Zr, which is greater than the workfunction of Hf. Similarly, in group VB, the workfunction of V is greater than the workfunction for Nb, which in turn is greater than the workfunction of Ta. This property allows materials to be selected for layer 24 that are appropriate for the resistive switching material being used.

It is often desirable to produce an electrode containing a metal that has a workfunction that is less than the workfunction of the metal in its pure form. For example, to form an ohmic contact between an electrode and an n-type metal oxide layer, it is desirable to use the electrode that has workfunction that is less than the workfunction of the metal oxide. Because a nitride of a given metal will generally have a lower work function than a pure metal, it is desirable to form an electrode from a nitride of a metal rather than from the metal itself. In addition, metal nitrides are generally more thermally stable than pure metals. Examples of binary nitrides that may be formed at step 48 include $Ti_mN_n$, $W_mN_n$, and $Nb_mN_n$ (e.g., for use with $Ti_xO_y$, and $W_xO_y$, and $Nb_xO_y$ metal oxide layers). Ternary nitrides may also be formed (e.g., $Ti_xAl_yN_z$, $Nb_xAl_yN_z$, and $W_xAl_yN_z$) but should be chosen for the desired work function.

Techniques that may be used to form layer 24 include physical vapor deposition (e.g., sputter deposition or evaporation), chemical vapor deposition, atomic layer deposition, and electrochemical deposition (e.g., electroless deposition or electroplating). If desired, more than one material may be used to form conductive layer 24. For example, conductive layer 24 may be formed from multiple sublayers of different materials or may be formed from a mixture of more than one element. The composition of layer 24 may also be altered using doping (e.g., by using ion implantation to add dopant to a metal or other material). The thickness of layer 24 may be in the range of 10-10000 angstroms (as an example). Layer 24 may serve as a lower electrode for device 12.

After the conductive layer of step 48 has been formed, one or more optional layers may be formed at step 50. These layers may, as an example, be used in forming electrical devices (current steering elements) such as device 38 of FIG. 2B. During step 52, one or more layers of semiconductor (e.g., doped and/or intrinsic silicon) may be formed and, if desired, one or more layers of conductor or other materials may be formed. If forming a diode, layers of n-type and p-type silicon may be deposited. The layers of step 50 may be deposited on conductive layer 24 using any suitable technique (e.g., physical vapor deposition, chemical vapor deposition, atomic layer deposition, or electrochemical deposition). Such electrical devices are optional and the layers of this step do not need to be formed, particularly, if the steering element is not interposed between the electrode and the metal oxide.

At step 52, metal oxide layer 22 may be deposited above the first conductive layer. If no optional layers were formed at step 52, the metal oxide layer may be deposited directly on the first conductive layer or may be formed by oxidizing the first conductive layer (e.g., using thermal oxidation in a furnace, oxidation in a rapid thermal oxidation tool, or oxidation by ion implantation of oxygen ions followed by an annealing step). If the optional layers of step 50 were deposited on the first conductive layer, metal oxide layer 22 may be formed on the optional layers, above the first conductive layer.

Metal oxide layer 22 may be formed of any suitable oxide. For example, metal oxide layer 22 may be formed from a transition metal such as nickel (i.e., to form nickel oxide). Other metals from which metal oxide may be formed include Ti, V, Cr, Mn, Zr, Nb, Mo, Hf, Ta, and W. Dopants such as Ti, Co, Zr, V, Al, and Nb may be used in forming layer 22 (as examples). Dopants may be introduced in any suitable concentration (e.g., an atomic concentration of 0-30%).

Metal oxide layer 22 may be formed from a non-stoichiometric material $Me_xO_y$, wherein Me is a metal from group IVB, VB, or VIB. Metal-rich metal oxides tend to form n-type semiconductors. Metal-deficient metal oxides tend to form p-type semiconductors. Nonstoichiometric metal oxides may exhibit better resistive switching properties than stoichiometric metal oxides. Particularly suitable metal oxides that may be formed at step 52 include $Ti_xO_y$, $Zr_xO_y$, $Hf_xO_y$, $V_xO_y$, $Nb_xO_y$, $Ta_xO_y$, $Cr_xO_y$, $Mo_xO_y$, and $W_xO_y$ (as examples).

During step 52, metal oxide layer 22 may be deposited as a single layer of material or as multiple sublayers. In arrangements in which layer 22 is formed of multiple sublayers, each sublayer may be formed by a potentially distinct fabrication process using a potentially distinct set of materials. For example, different sublayers in metal oxide layer 22 may be formed at different deposition pressures, temperatures, and power levels (e.g., different sputtering powers when layer 22 is deposited using PVD techniques). Different sublayers in metal oxide layer 22 may also be formed from different materials. For example, one sublayer may include dopant and another sublayer may not include dopant. If desired, the concentrations of the materials in layer 22 (e.g., the metal and/or the dopant) may be varied continuously, so that one layer runs into the next without any abrupt interfaces.

After forming metal oxide layer 22 at step 52, one or more optional layers may be formed on the metal oxide layer 22 at step 54. These layers may, as an example, be used to form electrical devices (current steering elements) such as device 38 of FIG. 2B. During step 54, one or more layers of semiconductor (e.g., doped and/or intrinsic silicon) may be formed and, if desired, one or more layers of conductor or other materials may be formed. If forming a diode, layers of n-type and p-type silicon may be deposited. The layers deposited during step 54 may be deposited on metal oxide layer 22 using any suitable technique (e.g., physical vapor deposition, chemical vapor deposition, atomic layer deposition, or electrochemical deposition). Such electrical devices are optional and this step does not need to be performed, particularly if the steering element is not interposed between the electrode and the metal oxide.

At step 56, a second conductive layer may be formed. For example, a layer of conductive material such as conductor 20 of FIGS. 2A and 2B may be formed. If one or more of the optional layers of step 54 have been deposited, the second conductive layer may be deposited on the optional layers above the metal oxide layer 22 that was deposited at step 52. If none of the optional layers of step 54 have been deposited, the second conductive layer may be deposited above the metal oxide layer 22. The second conductive layer may serve as an upper electrode for device 12. An ohmic contact or Schottky contact may be formed at the interface between the second conductive layer and metal oxide layer 22. Preferably, the second conductive layer is chosen to be Schottky (ohmic)

when the first conductive layer forms an ohmic (Schottky) contact to the metal oxide layer.

The second conductive layer may be formed from metals, metal nitrides (e.g., binary or ternary metal nitrides), metal silicides, or other suitable conductive materials. High work-function materials that may be used for forming a Schottky contact to (an n-type) metal oxide include Pt, Ir, Ru, Rh, Re, Pd, $Ti_xAl_yN_z$, $Ta_xAl_yN_z$, $W_xAl_yN_z$, $IrO_2$, and $RuO_2$. Techniques that may be used to form the second conductive layer include physical vapor deposition (e.g., sputter deposition or evaporation), chemical vapor deposition, atomic layer deposition, and electrochemical deposition (e.g., electroless deposition or electroplating). If desired, more than one material may be used to form the second conductive layer. For example, conductive layer 20 may be formed from multiple sublayers of different materials as shown in FIG. 2B or may be formed from a mixture of more than one element. The most prevalent metal in the second conductive layer may be the same as or different than the most prevalent metal in the metal oxide and first conductive layer. The second conductive layer may contain the most prevalent metal of the metal oxide and the first conductive layer (e.g., a metal nitride) in an atomic concentration of less than 10% (as an example).

At step 58, one or more optional layers may be formed on the conductive layer of step 56. For example, one or more layers of materials may be deposited. These layers may, as an example, be used to form electrical devices (current steering elements) such as devices 38 of FIG. 5 or FIG. 6. During step 58, one or more layers of semiconductor (e.g., doped and/or intrinsic silicon) may be formed and, if desired, one or more layers of conductor or other materials may be formed. If forming a diode, layers of n-type and p-type silicon may be deposited. The layers deposited during step 58 may be deposited on the second conductive layer using any suitable technique (e.g., physical vapor deposition, chemical vapor deposition, atomic layer deposition, or electrochemical deposition).

The foregoing is merely illustrative of the principles of this invention and various modifications can be made by those skilled in the art without departing from the scope and spirit of the invention.

What is claimed is:

1. A resistive switching nonvolatile memory element comprising:
   a first electrode;
   a second electrode;
   a layer of resistive switching nonstoichiometric metal oxide interposed between the first and second electrodes, wherein the first electrode and the resistive switching metal oxide contain a most prevalent metal that is the same;
   wherein the first electrode forms an ohmic contact with the metal oxide and wherein the second electrode forms a Schottky contact with the metal oxide.

2. The resistive switching nonvolatile memory element defined in claim 1, wherein the first electrode comprises a metal nitride.

3. The resistive switching nonvolatile memory element defined in claim 1 wherein the metal oxide contains at least one dopant.

4. The resistive switching nonvolatile memory element defined in claim 1 wherein the most prevalent metal in the nonstoichiometric metal oxide comprises a metal selected from the group consisting of: a transition metal, Al, Ti, V, Cr, Mn, Zr, Nb, Mo, Hf, Ta, and W.

5. The resistive switching nonvolatile memory element defined in claim 1 wherein the second electrode comprises a material selected from the group consisting of Pt, Ir, Ru, Rh, Re, Pd, TixAlyNz, TaxAlyNz, WxAlyNz, IrO2, and RuO2.

6. The resistive switching nonvolatile memory element defined in claim 1, wherein the resistive switching nonvolatile memory element is formed on an integrated circuit that includes a current steering element and wherein at least one of: 1) the first electrode and 2) the second electrode is coupled in series with the current steering element.

7. The resistive switching nonvolatile memory element defined in claim 1, wherein the metal oxide layer is formed from multiple sublayers of material.

8. The resistive switching nonvolatile memory element defined in claim 1, wherein the second electrode contains a most prevalent metal and wherein the most prevalent metal in the second electrode is different than the most prevalent metal in the first electrode and the most prevalent metal in the metal oxide layer.

9. The resistive switching nonvolatile memory element defined in claim 1 wherein the second electrode comprises at least first and second layers and wherein the first layer comprises a layer selected from the group consisting of: an adhesion layer and a barrier layer.

10. The resistive switching nonvolatile memory element defined in claim 9 wherein the second layer is a workfunction control layer.

11. The resistive switching nonvolatile memory element defined in claim 1 wherein one of the first electrode and the second electrode comprises a noble material.

* * * * *